United States Patent
Tsai et al.

(10) Patent No.: US 11,497,138 B2
(45) Date of Patent: Nov. 8, 2022

(54) LIQUID STORAGE DEVICE

(71) Applicant: COOLER MASTER CO., LTD., New Taipei (TW)

(72) Inventors: Shui-Fa Tsai, New Taipei (TW); Tsung-Wei Lin, New Taipei (TW)

(73) Assignee: COOLER MASTER CO., LTD., New Taipei (TW)

( * ) Notice: Subject to any disclaimer, the term of this patent is extended or adjusted under 35 U.S.C. 154(b) by 383 days.

(21) Appl. No.: 16/710,889

(22) Filed: Dec. 11, 2019

(65) Prior Publication Data

US 2020/0390005 A1   Dec. 10, 2020

(30) Foreign Application Priority Data

Jun. 6, 2019   (TW) .................................. 108119708

(51) Int. Cl.
| | | |
|---|---|---|
| *H05K 7/20* | (2006.01) | |
| *G06F 1/20* | (2006.01) | |
| *F04D 29/58* | (2006.01) | |
| *F04D 13/06* | (2006.01) | |
| *F04D 1/04* | (2006.01) | |

(52) U.S. Cl.
CPC ........... *H05K 7/20272* (2013.01); *F04D 1/04* (2013.01); *F04D 13/06* (2013.01); *F04D 29/586* (2013.01); *G06F 1/20* (2013.01); *G06F 2200/201* (2013.01)

(58) Field of Classification Search
CPC . H05K 7/20272; G06F 1/20; G06F 2200/201; G06F 1/182; F04D 29/586; F04D 1/04; F04D 13/06
See application file for complete search history.

(56) References Cited

U.S. PATENT DOCUMENTS

| | | | |
|---|---|---|---|
| 2011/0217193 A1* | 9/2011 | Wang ...................... | F04D 13/08 417/423.3 |
| 2016/0363967 A1* | 12/2016 | Tsai ................... | H05K 7/20272 |
| 2017/0351305 A1* | 12/2017 | Wei ........................ | H01L 23/473 |
| 2019/0317577 A1* | 10/2019 | Lin ..................... | H05K 7/20281 |

FOREIGN PATENT DOCUMENTS

| | | | | |
|---|---|---|---|---|
| JP | 2000230494 A | * | 8/2000 | ............... F04D 7/06 |
| KR | 20180107483 A | * | 10/2018 | ......... H05K 7/20272 |
| TW | M575883 U | * | 3/2019 | ............... G06F 1/20 |

* cited by examiner

*Primary Examiner* — Woody A Lee, Jr.
*Assistant Examiner* — Jesse M Prager
(74) *Attorney, Agent, or Firm* — Maschoff Brennan (57) ABSTRACT

The disclosure provides a liquid storage device configured for storing a working liquid and including a casing and a liquid driving device. The casing includes a reservoir and an accommodation part detachably disposed on the reservoir. The reservoir has a reservoir chamber. The liquid driving device is disposed in the accommodation part and forms a liquid chamber. The liquid driving device includes an impeller located in the liquid chamber and configured to force the working liquid to flow towards the liquid chamber from the reservoir chamber.

16 Claims, 10 Drawing Sheets

LIQUID STORAGE DEVICE

CROSS-REFERENCE TO RELATED APPLICATIONS

This non-provisional application claims priority under 35 U.S.C. § 119(a) on Patent Application No(s). 108119708 filed in Taiwan, R.O.C. on Jun. 6, 2019, the entire contents of which are hereby incorporated by reference.

TECHNICAL FIELD

The disclosure relates to a liquid storage device, more particularly to a liquid storage device including a liquid driving device.

BACKGROUND

As the processing speed and performance of an electronic device such as central processing unit (CPU) progress, a large amount of heat is generated during operation. The heat needs to be removed as soon as possible; otherwise the electronic device's internal temperature will increase. If the electronic device gets too hot internally, its internal circuits can be damaged. Therefore, cooling system is indispensable for the modern electronic device.

There are two types of cooling systems; liquid cooling and air cooling. In comparison to air cooling, liquid cooling is more effective in transporting heat away from a source because liquid materials are better conductors of heat. Therefore, to cool the same amount of heat as liquid cooling, air cooling needs to have its fan running faster which generates more noise and typically blows hot air back onto other components in the system. For the above reasons, liquid cooling is more efficient in maintaining a high-end computer to operate at a consistently cool temperature.

For a liquid cooling device, a water block is put on the parts required to be cooled, and a water pump, a radiator, and a reservoir are connected to the water block with various tubing. The water pump can pump liquid coolant from the reservoir into the water pump to absorb the heat, and then the heated coolant is pumped into the radiator where it is cooled. The liquid coolant is then pumped out again to the water block, and the cycle begins anew.

Conventionally, the reservoir is housed externally and connected to the pump via an external tube, and the reservoir should be located higher than the pump to prevent air/bubbles from going into the pump to damage the pump. Such an arrangement of reservoir and pump makes the liquid cooling device large in size, which occupies the space for the peripheral components to be installed.

SUMMARY

The disclosure provides a liquid storage device whose overall volume can be small and the liquid storage device would not occupy too much space in system.

One embodiment of this disclosure provides a liquid storage device configured for storing a working liquid and including a casing and a liquid driving device. The casing includes a reservoir and an accommodation part detachably disposed on the reservoir. The reservoir has a reservoir chamber. The liquid driving device is disposed in the accommodation part and forms a liquid chamber. The liquid driving device includes an impeller located in the liquid chamber and configured to force the working liquid to flow towards the liquid chamber from the reservoir chamber.

Another embodiment of this disclosure provides a liquid storage device configured for storing a working liquid and including a casing, a liquid driving device and a light emitting device. The casing includes a reservoir and an accommodation part detachably disposed on the reservoir. The reservoir has a reservoir chamber. The liquid driving device is disposed in the accommodation part and forms a liquid chamber. The liquid driving device includes an impeller located in the liquid chamber and configured to force the working liquid to flow towards the liquid chamber from the reservoir chamber. The light emitting device is disposed on the accommodation part and configured to light up the impeller.

Still another embodiment of this disclosure provides a liquid storage device configured for storing a working liquid and including a casing and a liquid driving device. The casing has a reservoir chamber and an accommodation space that are connected to each other. The liquid driving device is disposed in the accommodation space of the casing. The liquid driving device includes an impeller configured to force the working liquid to flow toward a liquid chamber of the accommodation space from the reservoir chamber. The casing further has a window area. The window area is located on a side of the impeller and located on an axial direction of the impeller, and the reservoir chamber is located on another side of the impeller and located on a radial direction of the impeller so that the impeller is visible outside from the window area.

Still yet another embodiment of this disclosure provides a liquid storage device configured for storing a working liquid and including a casing a liquid driving device and a light emitting device. The casing has a reservoir chamber and an accommodation space that are connected to each other. The liquid driving device is disposed in the accommodation space of the casing. The liquid driving device includes an impeller configured to force the working liquid to flow towards a liquid chamber of the accommodation space from the reservoir chamber. The light emitting device is disposed on the casing and configured to light up the impeller. The casing further has a window area. The window area is located on a side of the impeller and located on an axial direction of the impeller, and the reservoir chamber is located on a side of the impeller and located on a radial direction of the impeller so that the impeller is visible outside from the window area.

According to the liquid storage device discussed above, the reservoir is detachably disposed on the accommodation part without using additional tubing, so the overall volume of the liquid storage device can be small and the liquid storage device would not occupy too much space in system. Therefore, the peripheral components around the liquid storage device would be installed in a more flexible way.

Moreover, the window area is located on a side of the impeller and located on an axial direction A of the impeller, and the reservoir is located on another side of the impeller and not on the axial direction of the impeller, that is, the window area and the reservoir are located at different sides of the impeller, such that the reservoir does not block the window area. Therefore, the impeller can be exposed by the window area and be visible from outside. In short, beside the liquid storage device can store liquid, the liquid storage device also has the window area allowing user to see the visual effect presented by the impeller during the operation.

The above contents and following detailed descriptions are used to explain the principle of the disclosure and provide a further explanation of the claims.

DETAILED DESCRIPTION

Figure 1:
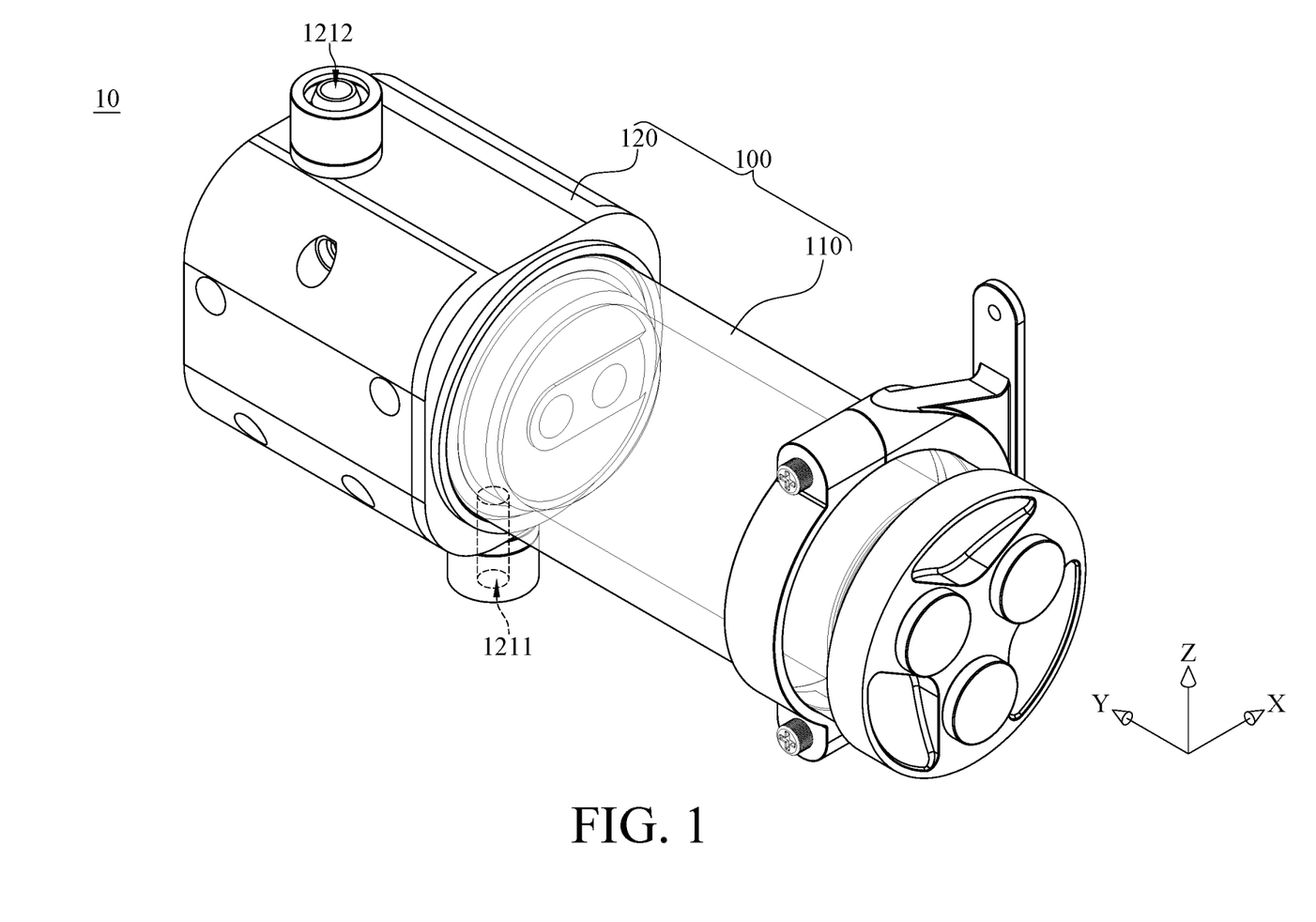
FIG. 1 is a perspective view of a liquid storage device according to a first embodiment of the disclosure.
Figure 2:
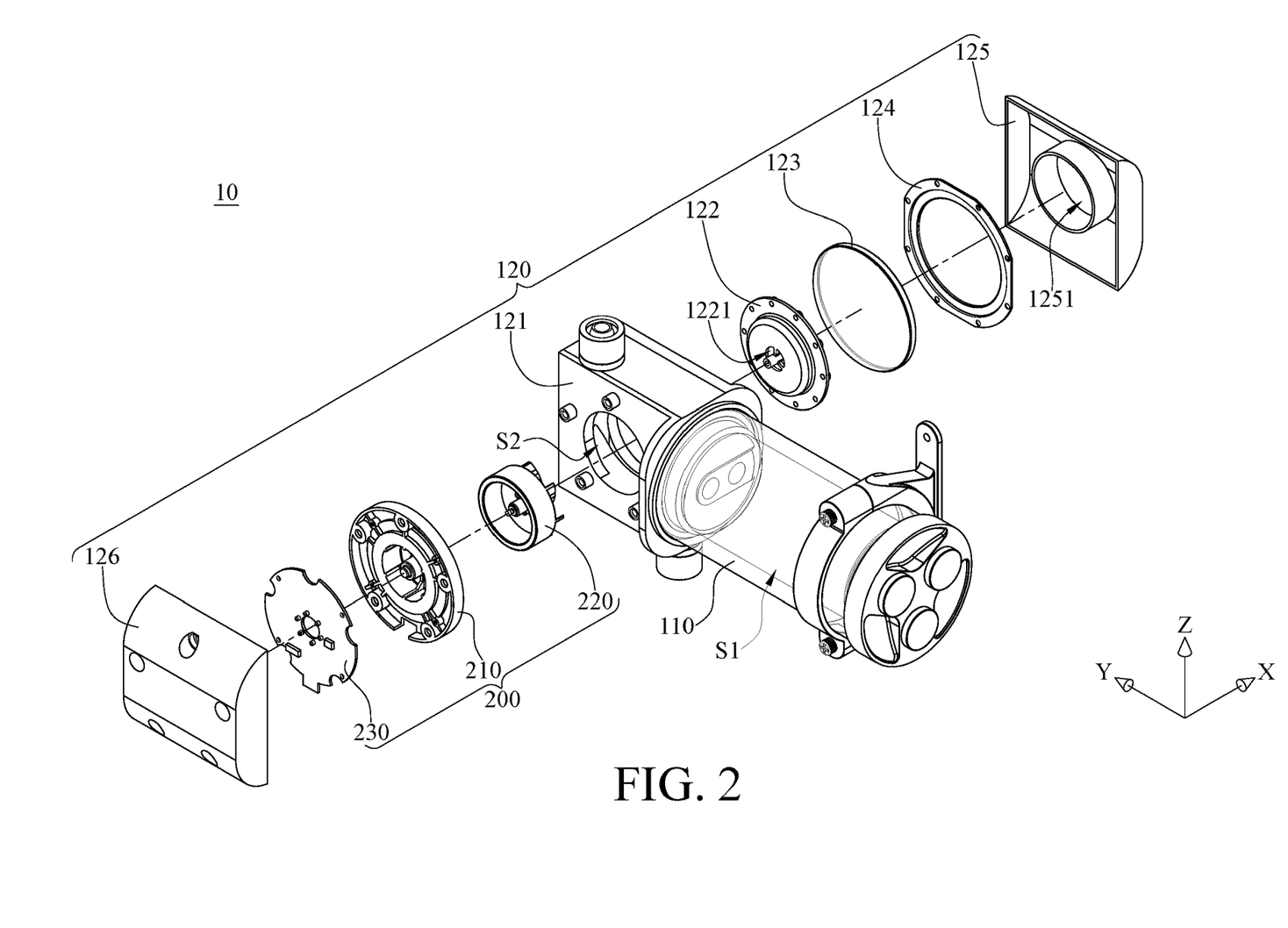
FIGS. 2-3 show exploded views of the liquid storage device in FIG. 1, taken from different perspectives.
Figure 3:
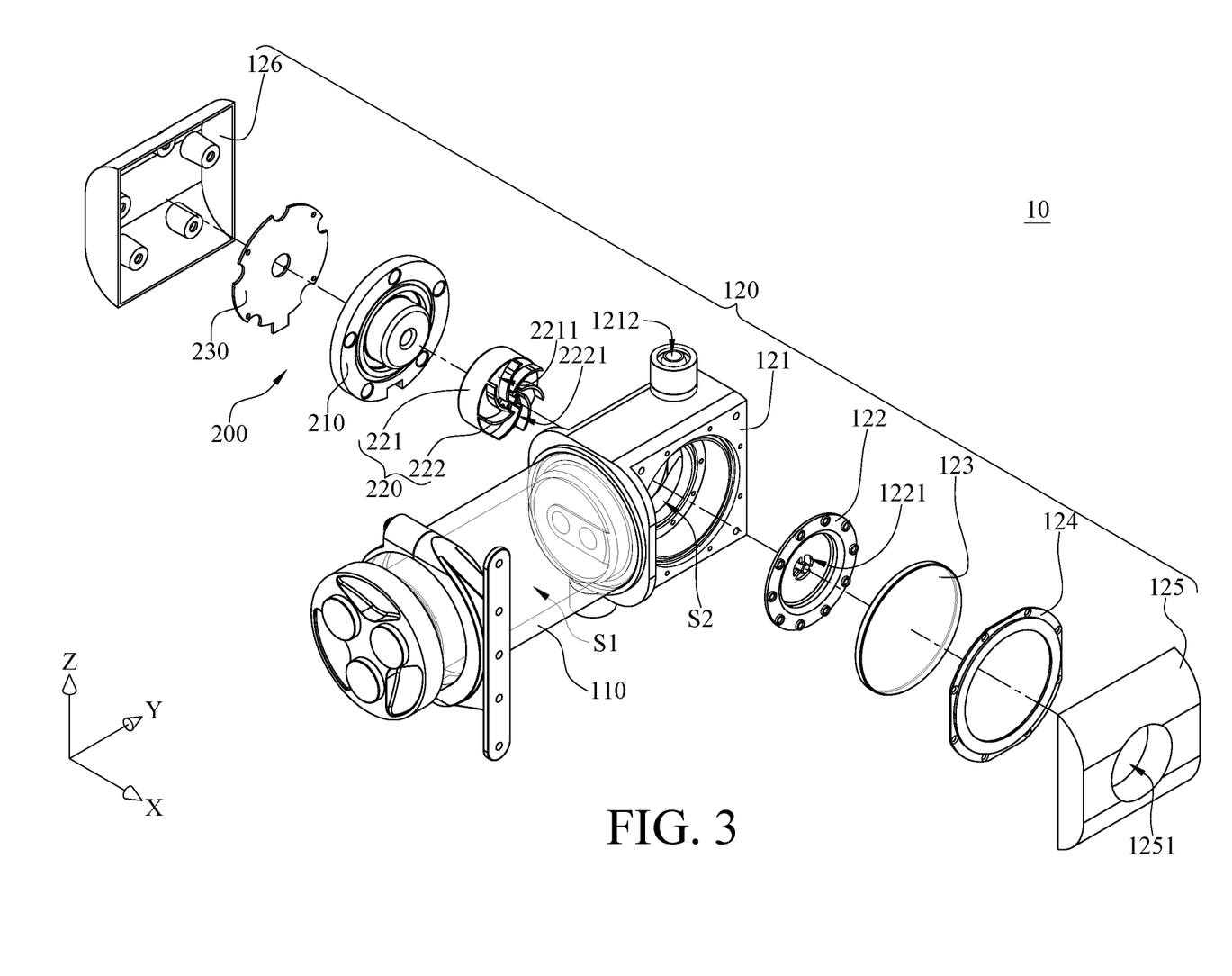

Please refer to FIG. 1 to FIG. 3. FIG. 1 is a perspective view of a liquid storage device according to a first embodiment of the disclosure. FIGS. 2-3 show exploded views of the liquid storage device in FIG. 1, taken from different perspectives.

This embodiment provides a liquid storage device 10 configured for storing working liquid (not shown), such as coolant.

The liquid storage device 10 includes a casing 100 and a liquid driving device 200. The casing 100 includes a reservoir 110 and an accommodation part 120. The reservoir 110 has a reservoir chamber S1 configured to store working liquid (not shown). In this embodiment, at least part of the reservoir 110 is light-permeable, allowing users to observe the working liquid stored in the reservoir 110. However, the disclosure is not limited to the material of the reservoir 110; in other embodiments, the whole of the reservoir may be opaque.

The reservoir 110 is detachably disposed on the accommodation part 120. In this embodiment, the reservoir 110 may be shaped to have a close fit with accommodation part 120. Specifically, the accommodation part 120 may have a protrusion used to be inserted into the reservoir 110 and sized to have a close fit with the reservoir 110, but the disclosure is not limited thereto. In other embodiment, the accommodation part and the reservoir may be fixed to each other by adhering or screwing.

The reservoir 110 is detachably disposed on the accommodation part 120 without using additional tubing, so the overall volume of the liquid storage device 10 can be small, and the liquid storage device 10 would not occupy too much space in system.

Figure 4:
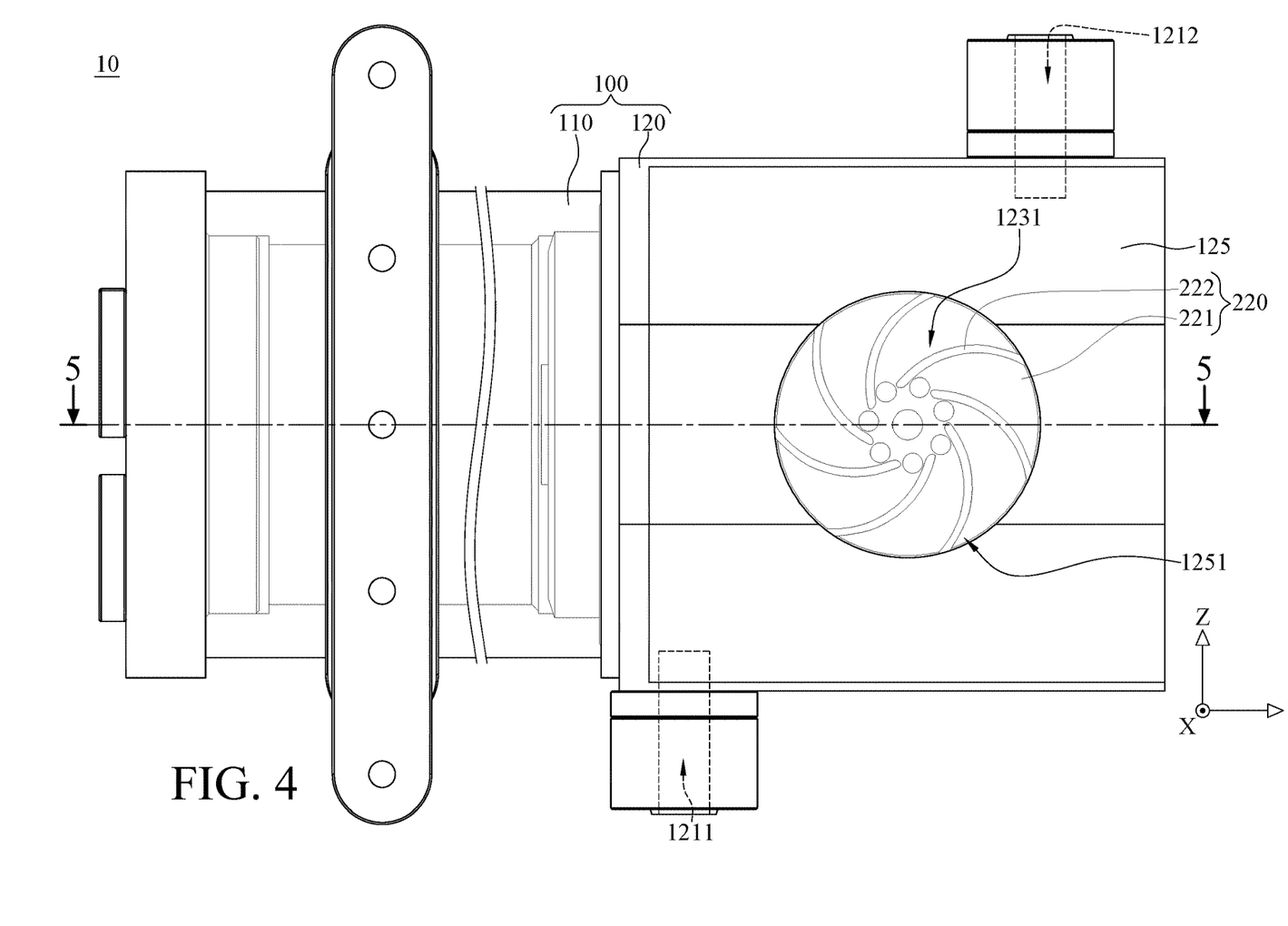
FIG. 4 is a side schematic view of the liquid storage device in FIG. 1.
Figure 5:
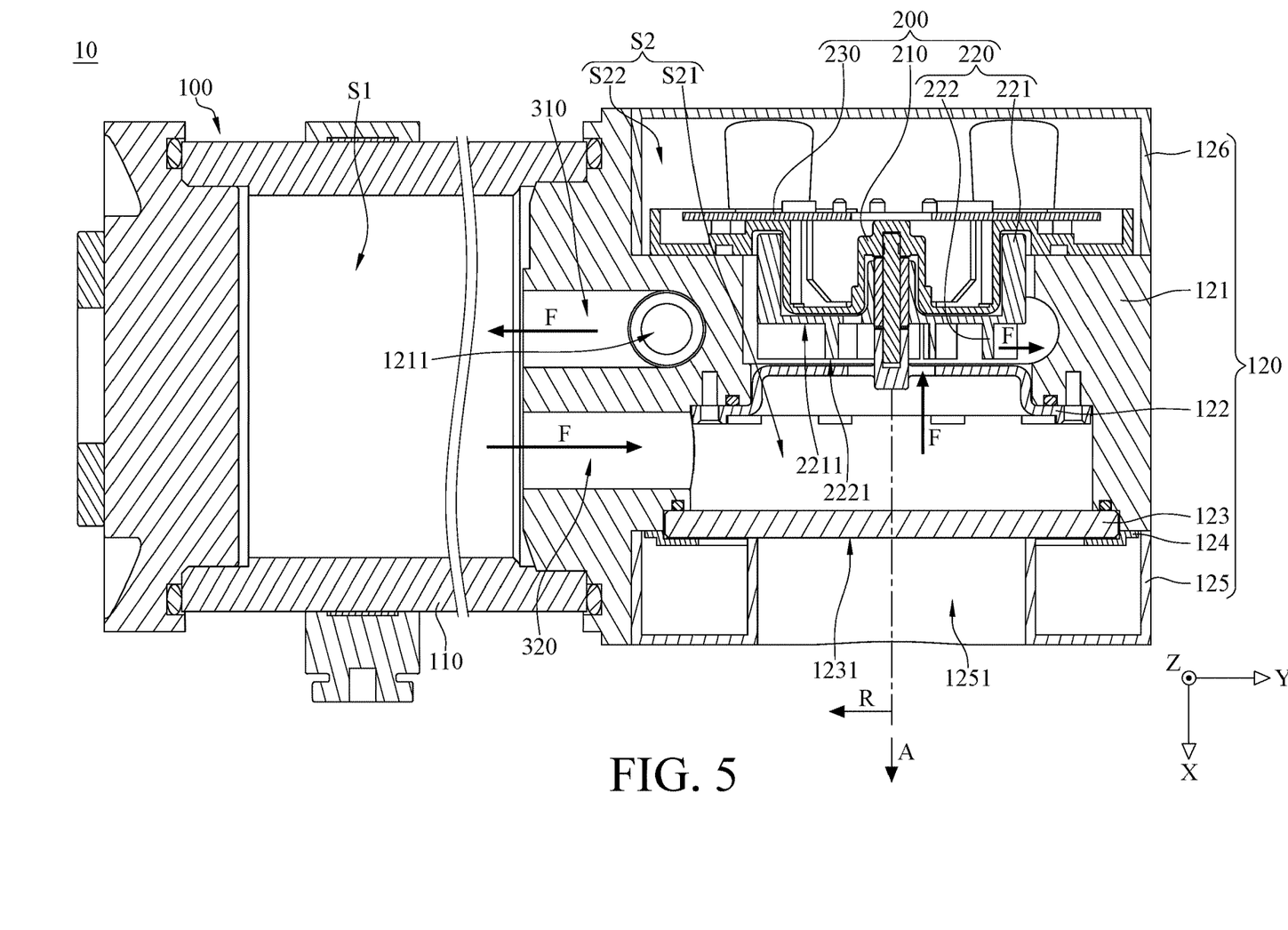
FIG. 5 is a cross-sectional view of the liquid storage device taking along line 5-5 in FIG. 4.
Figure 6:
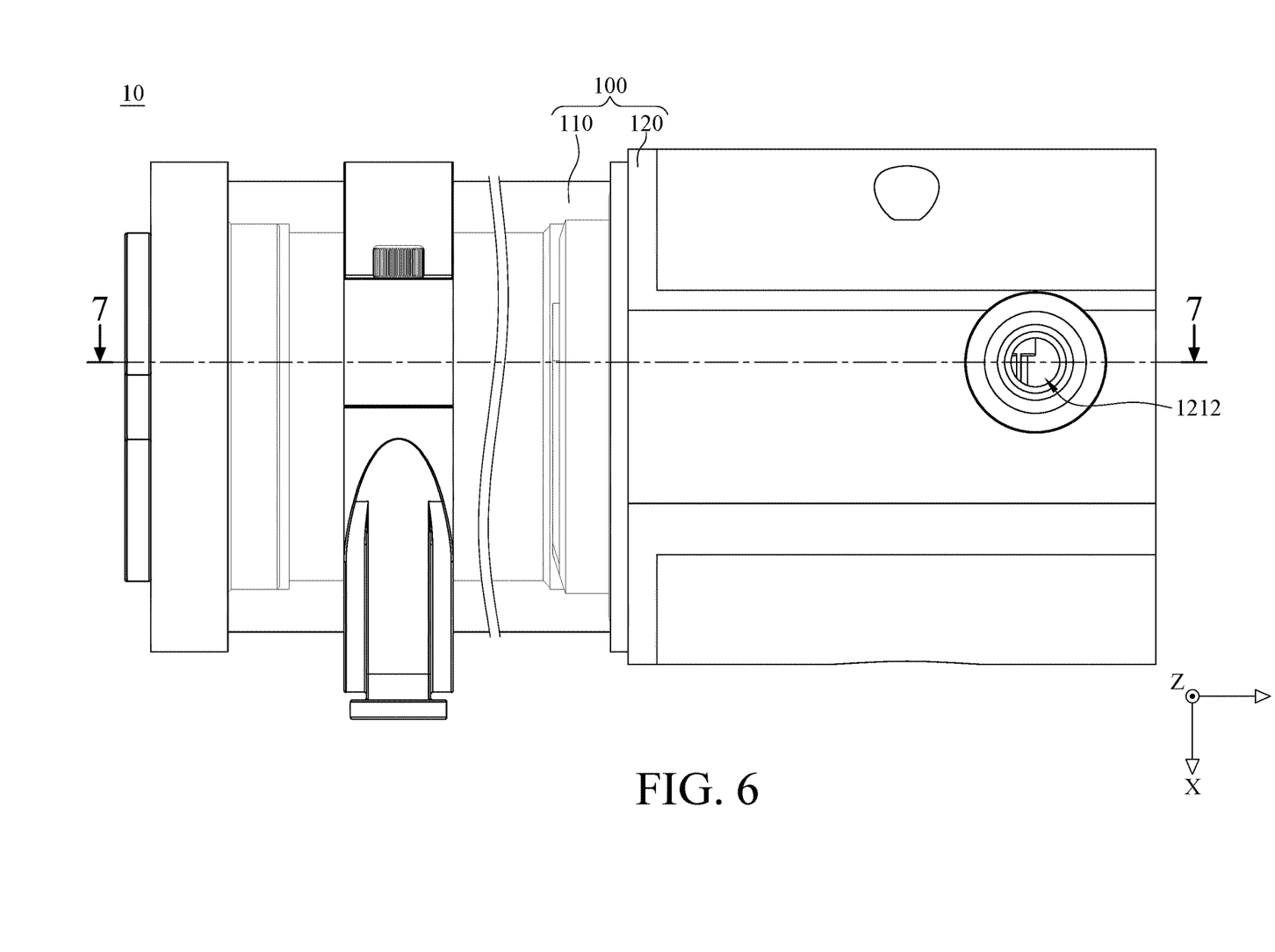
FIG. 6 is a top schematic view of the liquid storage device in FIG. 1.
Figure 7:
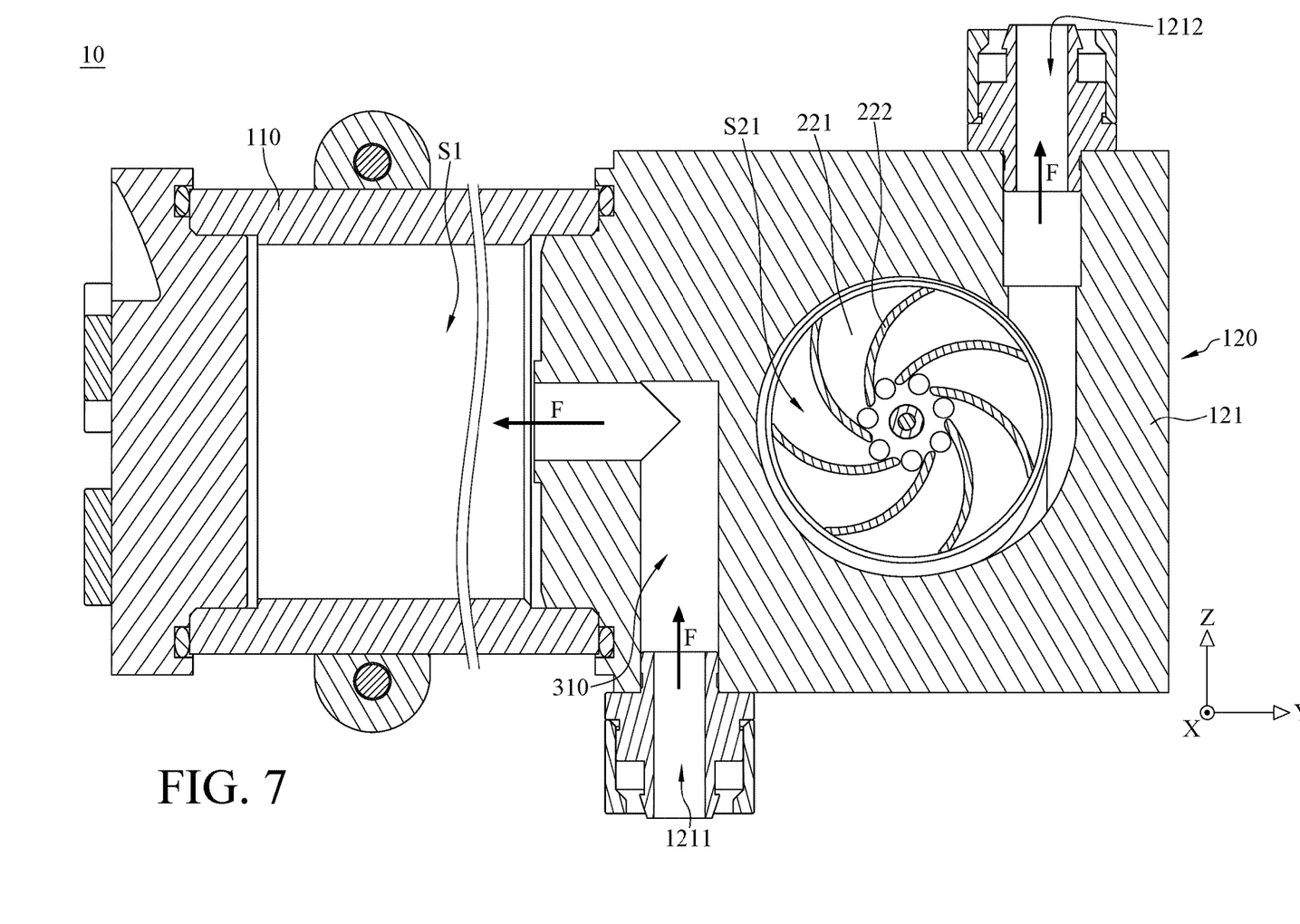
FIG. 7 is a cross-sectional view of the liquid storage device taking along line 7-7 in FIG. 6.

Further, please refer to FIG. 3 to FIG. 7. FIG. 4 is a side schematic view of the liquid storage device in FIG. 1. FIG. 5 is a cross-sectional view of the liquid storage device taking along a line 5-5 in FIG. 4. FIG. 6 is a top schematic view of the liquid storage device in FIG. 1. FIG. 7 is a cross-sectional view of the liquid storage device taking along a line 7-7 in FIG. 6.

As shown in FIG. 3 and FIG. 5, the accommodation part 120 includes a main body 121, a light-permeable guide plate 122, a light-permeable cover plate 123, an annular mount plate 124, a first cover 125, and a second cover 126. The main body 121 forms an accommodation space S2.

As shown in FIG. 3 and FIG. 5, the liquid driving device 200 is disposed in the accommodation space S2 of the accommodation part 120. The liquid driving device 200 may include a division plate 210, an impeller 220, and a power source 230. The division plate 210 divides the accommodation space S2 into a liquid chamber S21 and a liquid-tight chamber S22. The liquid chamber S21 and the liquid-tight chamber S22 are not connected to each other. The impeller 220 is rotatably disposed on the division plate 210. The power source 230 is located in the liquid-tight chamber S22. The power source 230 is configured to drive the impeller 220 to rotate relative to the division plate 210 in order to force the working liquid to flow from the reservoir chamber S1 to the liquid chamber S21.

As shown in FIG. 3 and FIG. 5, the light-permeable guide plate 122 is located in the liquid chamber S21 and covers the impeller 220. The light-permeable guide plate 122 has a plurality of through holes 1221 for the working liquid in the liquid chamber S21 to flow through the light-permeable guide plate 122. The light-permeable cover plate 123 is disposed on the main body 121 via the annular mount plate 124. For example, the light-permeable cover plate 123 covers a side of the liquid chamber S21 of the accommodation space S2. The liquid chamber S21 is located between the light-permeable cover plate 123 and the division plate 210. The first cover 125 has an opening 1251. The first cover 125 is disposed on the main body 121. The part of the light-permeable cover plate 123 that is not covered by the first cover 125 is exposed from the opening 1251 of the first cover 125 and can be defined as a window area 1231 for observation of the internal components.

In this embodiment, the window area 1231 is located on a side of the impeller 220 and on an axial direction A of the impeller 220, and the reservoir chamber S1 is located on another side of the impeller 220 and not on the axial direction A of the impeller 220 so the reservoir 110 does not block the window area 1231, such that the impeller 220 may be visible from outside the window area 1231.

The second cover 126 is disposed on the main body 121 and covers another side of the accommodation space S2. The liquid-tight chamber S22 is located between the second cover 126 and the division plate 210.

In this and other embodiments, the impeller 220 further includes a base portion 221 and a plurality of vane portions 222. The part of the base portion 221 that is not covered by the first cover 125 and faces the window area 1231 can be defined as a first exposed surface 2211. The vane portions 222 protrude toward the window area 1231 from the base portion 221. The part of each of the vane portions 222 that is not covered by the first cover 125 and faces the window area 1231 can be defined as a second exposed surface 2221. The second exposed surfaces 2221 and the first exposed surface 2211 can present different visual effects. For example, the first exposed surface 2211 and the second exposed surfaces 2221 can be painted different colors.

In this or some other embodiments, the first exposed surface 2211 may be painted yellow, and the second exposed surfaces 2221 may be painted black to provide contrast to the color yellow. It is understood that the first exposed surface 2211 and the second exposed surfaces 2221 may be in other contrasting colors, such as black and white, red and green, or yellow and purple. As such, during the rotation of the impeller 220, the colors of the first exposed surface 2211 and the second exposed surfaces 2221 change faster than human's eyes could see the individual colors, so the reflections of all of the colors blended and that makes people see a different visual effect, such as a secondary color.

In this or other embodiments, the main body 121 of the accommodation part 120 further has a liquid inlet 1211 and a liquid outlet 1212. The liquid inlet 1211 is connected to the reservoir chamber S1 via a first channel 310. The reservoir chamber S1 is connected to the liquid chamber S21 via a second channel 320. The liquid outlet 1212 is connected to the liquid chamber S21.

In this embodiment, the first channel 310 and the second channel 320 are not limited to be directly formed in the main body 121. In other embodiments, as long as the first channel and the second channel are located inside the casing, the first channel and the second channel may be formed in additional tubes or may be directly formed in the reservoir.

The first channel 310 and the second channel 320 are located inside the casing 100, such that the casing 100 has a simple and clean appearance and thus having less interference with the peripheral components.

As shown in FIG. 5 and FIG. 7, the impeller 220 can force the working liquid in the liquid storage device 10 to sequentially flow through the liquid inlet 1211, the first channel 310, the reservoir chamber S1, the second channel 320, the liquid chamber S21, and then the liquid outlet 1212 along a path (e.g., path F shown in FIGS. 5 and 7).

In other embodiments, as long as the window area is located on a side of the impeller and on the axial direction of the impeller and the reservoir chamber is located on another side of the impeller and on the radial direction of the impeller, the reservoir may also be integrally formed with the accommodation part. In still other embodiments, as long as the reservoir is detachably disposed on the accommodation part, the window area may be located on a side of the impeller and on the radial direction of the impeller, and the reservoir chamber may be located on another side of the impeller and on the axial direction of the impeller; in such embodiments, the accommodation part may have no window area.

Figure 8:
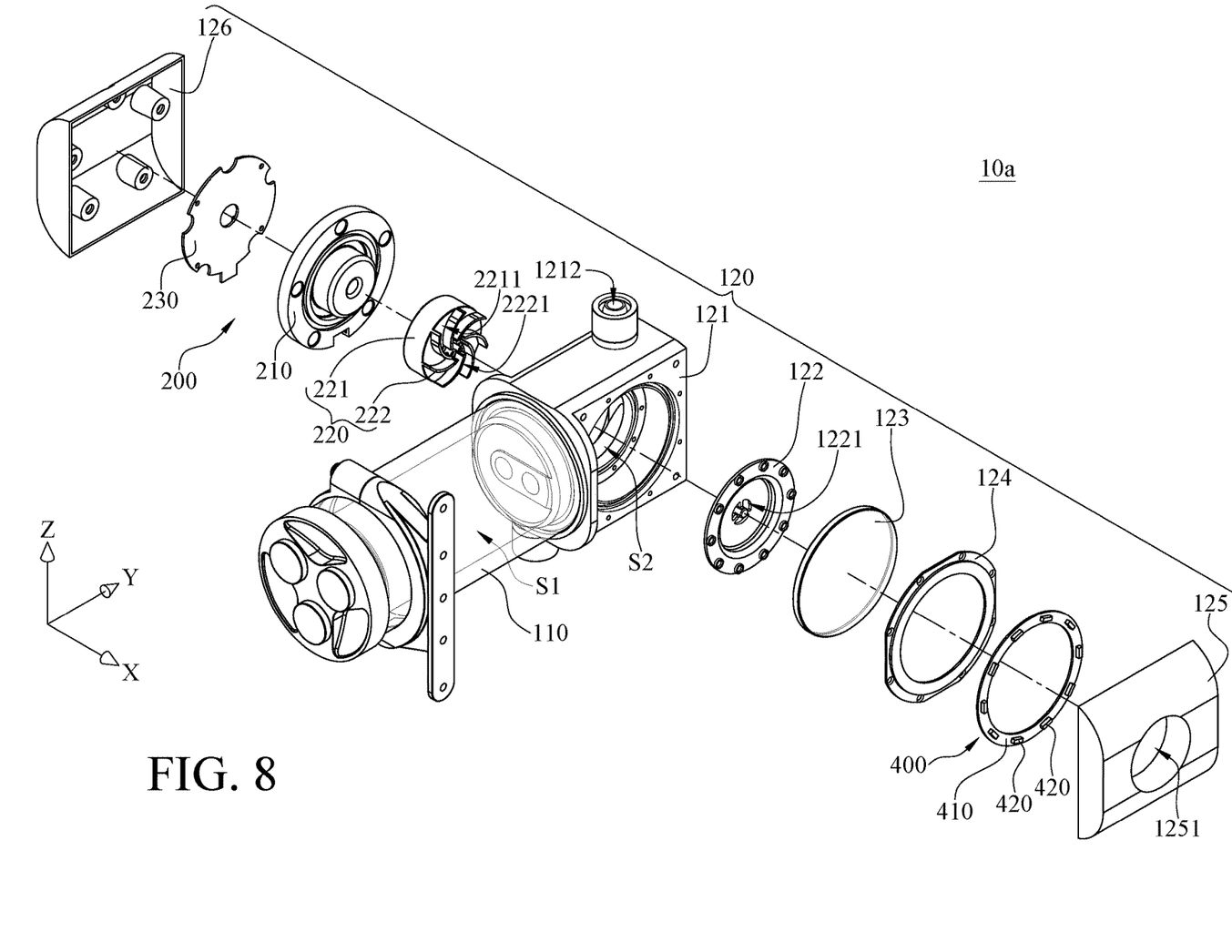
FIG. 8 is an exploded view of a liquid storage device according to a second embodiment of the disclosure.
Figure 9:
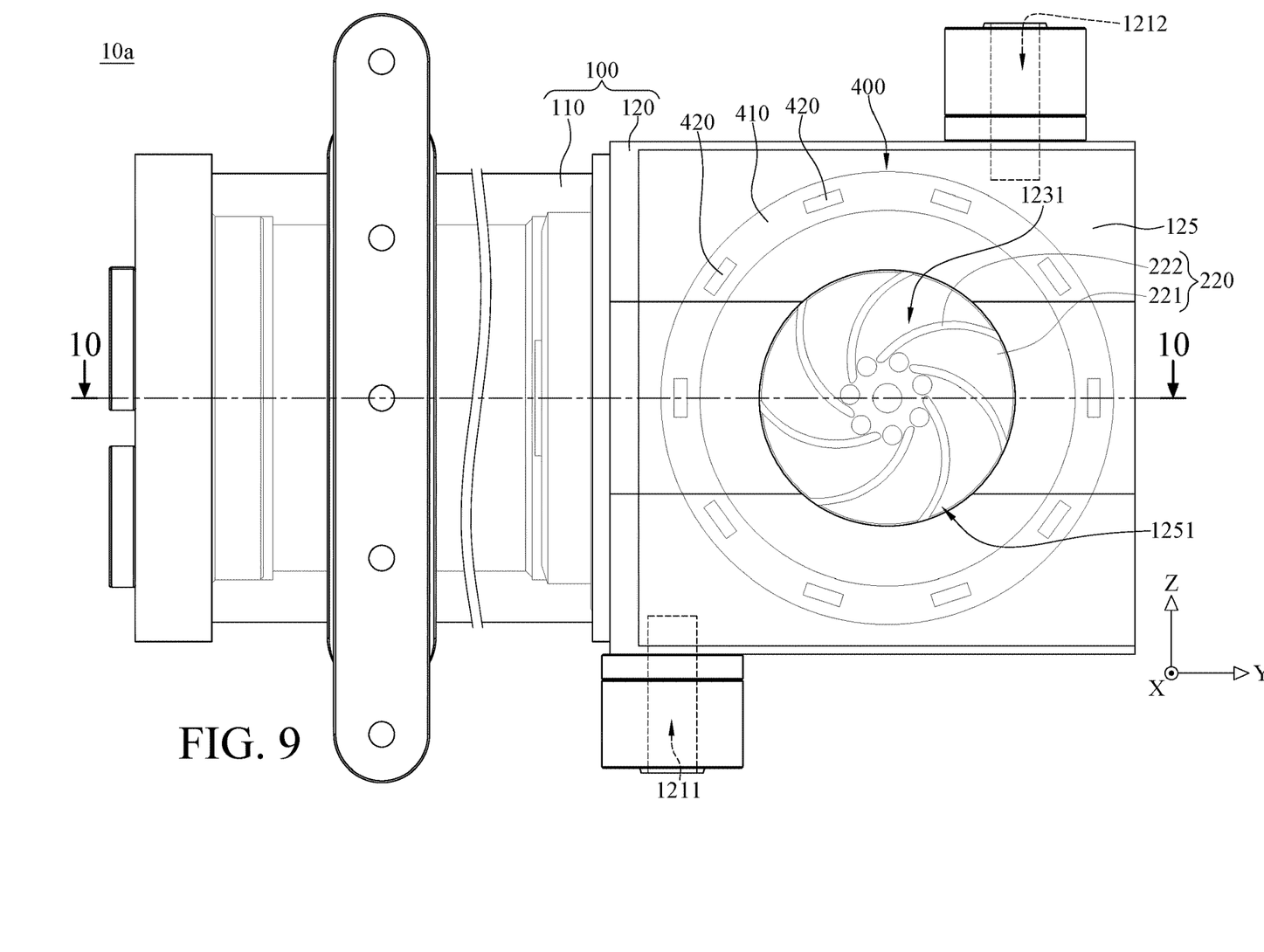
FIG. 9 is a side schematic view of the liquid storage device in FIG. 8.
Figure 10:
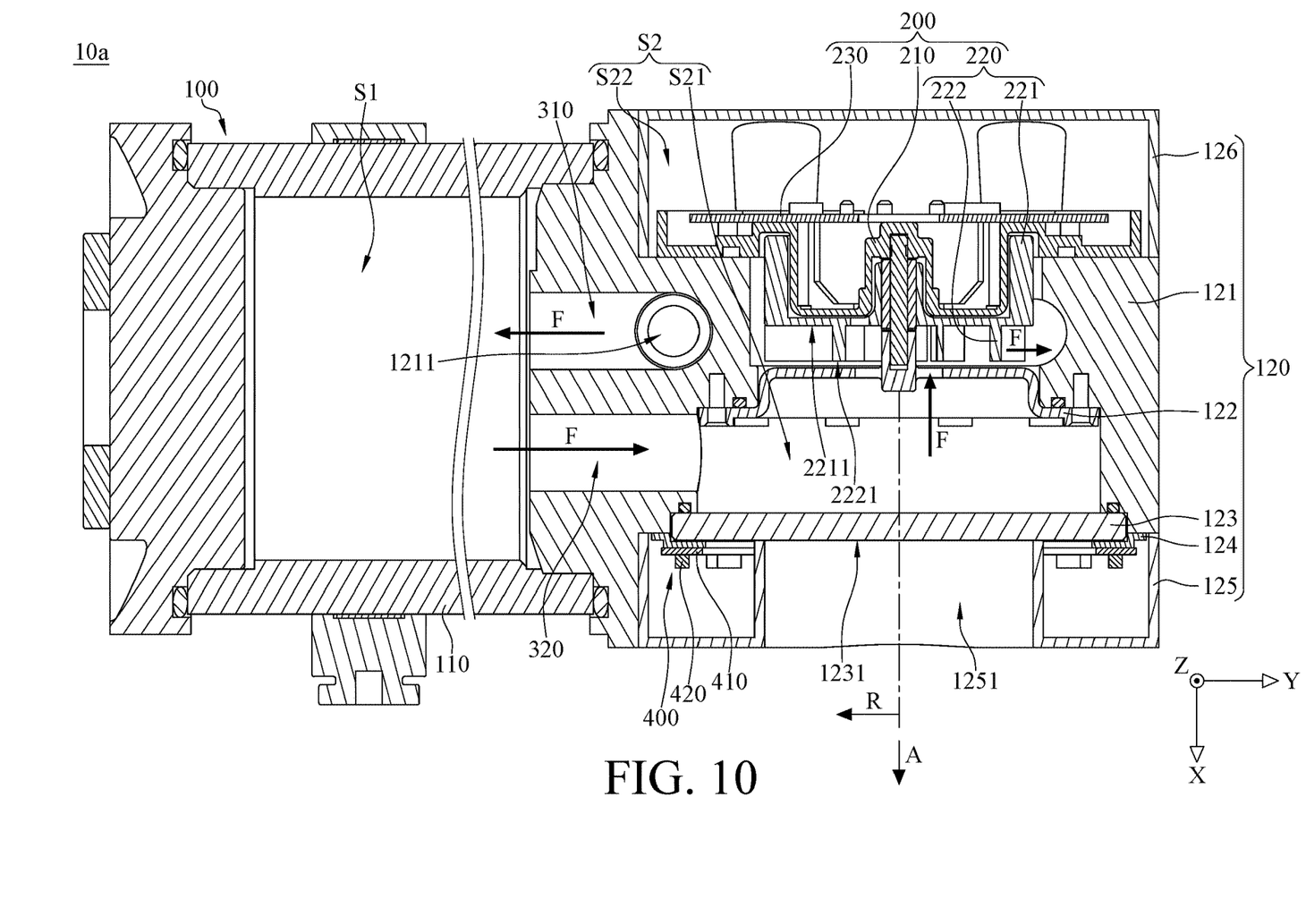
FIG. 10 is a cross-sectional view of the liquid storage device taking along line 10-10 in FIG. 9.

Please refer to FIG. 8 to FIG. 10. FIG. 8 is an exploded view of a liquid storage device according to a second embodiment of the disclosure. FIG. 9 is a front schematic view of the liquid storage device in FIG. 8. FIG. 10 is a cross-sectional view of the liquid storage device taking along a line 10-10 in FIG. 9. This embodiment provides a liquid storage device 10a configured for storing working liquid (not shown), such as coolant.

The liquid storage device 10a includes a casing 100 and a liquid driving device 200. Note that the same reference number denotes the same component. For the purpose of brevity, the descriptions of the same or similar components are omitted and can be referred to the previous embodiments.

In this embodiment, the liquid storage device 10a further includes a light emitting device 400. The light emitting device 400 includes an annular circuit board 410 and a plurality of light sources 420. The annular circuit board 410 is stacked on the annular mount plate 124. The light sources 420 are disposed on the annular circuit board 410. The light sources 420 are, for example, light emitting diodes. The light sources 420 are configured to light up the impeller 220 to enhance the visual effect created by the liquid storage device 10a.

According to the liquid storage device discussed above, the reservoir is detachably disposed on the accommodation part without using additional tubing, so the overall volume of the liquid storage device can be small and the liquid storage device would not occupy too much space in system. Therefore, the peripheral components around the liquid storage device would be installed in a more flexible way.

Moreover, the window area is located on a side of the impeller and on an axial direction A of the impeller, and the reservoir is located on another side of the impeller and not on the axial direction of the impeller, that is, the window area and the reservoir are located at different sides of the impeller, such that the reservoir does not block the window area. Therefore, the impeller can be exposed by the window area and be visible from outside. In short, besides being able to store liquid, the liquid storage device also has the window area allowing user to see the visual effect presented by the impeller during the operation.

It will be apparent to those skilled in the art that various modifications and variations can be made to the present invention. It is intended that the specification and examples be considered as exemplary embodiments only, with a scope of the invention being indicated by the following claims and their equivalents.

What is claimed is:

1. A liquid storage device, configured for storing a working liquid, the liquid storage device comprising:
    a casing, comprising a reservoir and an accommodation part detachably disposed on the reservoir, wherein the reservoir has a reservoir chamber; and
    a liquid driving device, disposed in the accommodation part and forming a liquid chamber, wherein the liquid driving device comprises an impeller located in the liquid chamber and configured to force the working liquid to flow towards the liquid chamber from the reservoir chamber;
    wherein the accommodation part further has a window area, and the impeller is exposed from the window area;
    wherein the accommodation part has an accommodation space, the liquid driving device is located in the accommodation space and comprises a division plate and a power source, the division plate divides the accommodation space into the liquid chamber and a liquid-tight chamber, the liquid chamber and the liquid-tight chamber are not connected to each other, the impeller is rotatably disposed on the division plate, and the power source is located in the liquid-tight chamber and configured to drive the impeller to rotate relative to the division plate;
    wherein the accommodation part comprises an main body, a light-permeable guide plate, a light-permeable cover plate, an annular mount plate, a first cover and a second cover, the main body forms the accommodation space, the light-permeable guide plate is located in the liquid chamber and has at least one through hole, the light-permeable cover plate is disposed on the main body via the annular mount plate and covers a side of the accommodation space, the liquid chamber is located between the light-permeable cover plate and the division plate, the first cover has an opening; the first cover is disposed on the main body, a part of the light-permeable cover plate that is not covered by the first cover is exposed from the opening and is defined as a window area, the second cover is disposed on the main body and covers another side of the accommodation space, and the liquid-tight chamber is located between the second cover and the division plate.

2. The liquid storage device according to claim 1, wherein the impeller comprises a base portion and a plurality of vane portions, the base portion has a first exposed surface facing the window area, the plurality of vane portions protrude towards the window area from the base portion, each of the plurality of vane portions have a second exposed surface facing the window area.

3. The liquid storage device according to claim 2, wherein the first exposed surface and the second exposed surface are different in color.

4. The liquid storage device according to claim 2, wherein the first exposed surface and the second exposed surface are in contrasting colors.

5. The liquid storage device according to claim 1, wherein the accommodation part further has a liquid inlet and a liquid outlet, the liquid inlet is connected to the reservoir chamber via a first channel, the reservoir chamber is connected to the liquid chamber in the accommodation space via a second channel, and the liquid outlet is connected to the liquid chamber.

6. The liquid storage device according to claim 5, wherein the first channel and the second channel are located inside the casing.

7. The liquid storage device according to claim 1, wherein at least part of the reservoir is light-permeable.

8. The liquid storage device according to claim 1, wherein the reservoir has a close fit with the accommodation part.

9. A liquid storage device, configured for storing a working liquid, the liquid storage device comprising:
- a casing, having a reservoir chamber and an accommodation space that are connected to each other; and
- a liquid driving device, disposed in the accommodation space of the casing, wherein the liquid driving device comprises an impeller configured to force the working liquid to flow toward a liquid chamber of the accommodation space from the reservoir chamber;
- wherein, the casing further has a window area, the window area is located on a side of the impeller and located on an axial direction of the impeller and the reservoir chamber is located on another side of the impeller and located on a radial direction of the impeller so that the impeller is visible outside from the window area;
- wherein the casing comprises a reservoir and an accommodation part, the reservoir chamber is formed by the reservoir, the accommodation space is formed by the accommodation part, and the reservoir is detachably disposed on the accommodation part;
- wherein the accommodation part comprises an main body, a light-permeable guide plate, a light-permeable cover plate, an annular mount plate, a first cover and a second cover, the main body forms the accommodation space, the light-permeable guide plate is located in the liquid chamber and has at least one through hole, the light-permeable cover plate is disposed on the main body via the annular mount plate and covers a side of the accommodation space, the liquid chamber is located between the light-permeable cover plate and a division plate, the first cover has an opening; the first cover is disposed on the main body, a part of the light-permeable cover plate that is not covered by the first cover is exposed from the opening and is defined as the window area, the second cover is disposed on the main body and covers another side of the accommodation space, and a liquid-tight chamber is located between the second cover and the division plate.

10. The liquid storage device according to claim 9, wherein the impeller comprises a base portion and a plurality of vane portions, the base portion has a first exposed surface facing the window area, the plurality of vane portions protrude towards the window area from the base portion, each of the plurality of vane portions have a second exposed surface facing the window area.

11. The liquid storage device according to claim 10, wherein the first exposed surface and the second exposed surface are different in color.

12. The liquid storage device according to claim 10, wherein the first exposed surface and the second exposed surface are in contrasting colors.

13. The liquid storage device according to claim 9, wherein at least part of the reservoir is light-permeable.

14. The liquid storage device according to claim 9, wherein the casing further has a liquid inlet and a liquid outlet, the liquid inlet is connected to the reservoir chamber via a first channel, the reservoir chamber is connected to the liquid chamber via a second channel, and the liquid outlet is connected to the liquid chamber.

15. The liquid storage device according to claim 14, wherein the first channel and the second channel are located inside the casing.

16. The liquid storage device according to claim 9, wherein the reservoir has a close fit with the accommodation part.

* * * * *